(12) United States Patent
Nishizawa et al.

(10) Patent No.: US 6,984,849 B2
(45) Date of Patent: Jan. 10, 2006

(54) OPTICAL CAP FOR SEMICONDUCTOR DEVICE

(75) Inventors: Hironori Nishizawa, Nagano (JP); Yasushi Hatakeyama, Nagano (JP); Toshihisa Yoda, Nagano (JP); Kenji Kawamura, Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 14 days.

(21) Appl. No.: 10/814,276

(22) Filed: Apr. 1, 2004

(65) Prior Publication Data

US 2004/0195580 A1 Oct. 7, 2004

(30) Foreign Application Priority Data

Apr. 4, 2003 (JP) ......................................... 2003-101222
Sep. 4, 2003 (JP) ......................................... 2003-312128
Nov. 10, 2003 (JP) ......................................... 2003-379849

(51) Int. Cl.
*H01L 27/15* (2006.01)
*H01L 31/12* (2006.01)
*H01L 33/00* (2006.01)

(52) U.S. Cl. .............................. 257/81; 257/82; 257/99

(58) Field of Classification Search ............. 257/80–82, 257/99
See application file for complete search history.

(56) References Cited

U.S. PATENT DOCUMENTS 6,528,825 B2 * 3/2003 Yoshida ........................ 257/81
6,639,248 B2 * 10/2003 Aizawa et al. ................. 257/82

FOREIGN PATENT DOCUMENTS

JP    2003-34549    2/2003

* cited by examiner

*Primary Examiner*—Cuong Nguyen
(74) *Attorney, Agent, or Firm*—Staas & Halsey LLP

(57) ABSTRACT

An optical cap for semiconductor device, the cap comprising: a metal cap body having an opening and a transparent optical window sealed with the metal cap body to cover the opening by means of a sealing member. The sealing member includes a bismuth low-melting point glass containing no lead, an intermediate metal layer attached to the metal cap body, the intermediate metal layer being a metal capable of causing a eutectic reaction with respect to Bi contained in the low-melting point glass, and an eutectic alloy layer thus formed between the low-melting point glass and the intermediate metal layer.

10 Claims, 3 Drawing Sheets

OPTICAL CAP FOR SEMICONDUCTOR DEVICE

BACKGROUND OF THE INVENTION

1. Field of the Invention

The present invention relates to a cap for a semiconductor device and, more particularly, to a cap for a semiconductor device having a cap body with which an optical window is sealed by means of a low-melting point glass.

2. Description of the Related Art

A semiconductor device including a laser diode mounted thereon has been conventionally known in the prior art. In such a device, as shown in FIG. 1, a laser diode 30 is mounted on a stem 20 and covered by a semiconductor device cap 10 so that the laser diode is accommodated and hermetically sealed in the cap 10. The semiconductor device cap 10 is made by press-forming a metal plate to form a cap body 12 having a light transmitting opening 12a and adding a light transmitting window 14 made of a glass plate which is sealed to the periphery of the light transmitting opening of the cap body by means of a low-melting point glass 16. In FIG. 1, reference numerals 22 and 24 indicate leads; 26, a glass seal; and 28, a holder for laser diode.

One of conventional methods for sealing the light transmitting window 14 with the cap body 12 is that the cap body 12 is heated in the atmosphere to form an oxidized film on a surface thereof and, then, using the oxidized film the light transmitting window 14 is sealed by means of a low-melting point glass. Another method is that nickel is plated on a surface of the cap body 12 and a Ni—Pb eutectic alloy layer is formed at the time of sealing by an eutectic reaction between a lead component contained in the low-melting point glass and Ni contained in the nickel plated layer, so that the light transmitting window 14 is sealed by means of a low-melting point glass and the eutectic alloy layer.

FIG. 5 is an enlarged view of a sealing portion (A in FIG. 1) in which the light transmitting window 14 is sealed with the cap body using an eutectic reaction between Pb-component contained in the low-melting point glass 16 and Ni in the nickel plated layer 18. In FIG. 3, the reference numeral 12 denotes a metal cap body; 18, a nickel layer plated on the cap body; and 20, an eutectic alloy layer of Ni—Pb.

Recently, however, since it is pointed out that the natural environment is affected by lead and, therefore, not using lead has been promoted in many production processes for various goods. In a method of producing an optical cap for semiconductor device using a low-melting point glass containing lead, using no or little lead has been required. Under such circumstances, there is a proposal to produce an optical cap for semiconductor device using a low-melting point glass containing no lead. For example, in Unexamined Japanese Patent Publication No. 2003-34549, it has been proposed that a glass of SnO—$P_2O_5$, containing no lead is used as a sealing glass for sealing a light transmitting window.

In a process for producing a semiconductor device cap in which a laser diode is installed, using no lead has been proposed by using a glass of SnO—$P_2O_5$, containing no lead, for sealing the light transmitting window. However, there is a problem that a glass of SnO—$P_2O_5$ is not sufficient in moisture resistance and reliability, as a better sealing performance and reliability are required for a sealing cap used in a semiconductor device.

SUMMARY OF THE INVENTION

An object of the present invention is to provide a semiconductor device cap capable of solving the above-mentioned problems.

Another object of the present invention is to provide a cap which can be advantageously used in a semiconductor device on which an optical element, such as a laser diode, can be mounted and has a high moisture resistance.

Still another object of the present invention is to provide a semiconductor device including an optical cap which can be produced using a low-melting point glass, including no lead, as a sealing material during the production processes thereof.

According to the present invention, there is provided an optical cap structure for semiconductor device, the structure comprising: a cap body having an opening; an optical window made of glass plate sealed with the cap body to cover the opening so that an optical beam transmits through the optical window; and a sealing member for sealing the optical window with the metal cap, the sealing member including a bismuth low-melting point glass containing no lead, an intermediate metal layer attached to the metal cap body, the intermediate metal layer being a metal capable of causing an eutectic reaction with respect to Bi contained in the low-melting point glass, and an eutectic alloy layer thus formed between the low-melting point glass and the intermediate metal layer.

The intermediate metal is a plated gold, so that the optical window is sealed with the cap body by means of the eutectic alloy between Bi contained in the low-melting point glass and Au of the intermediate metal.

The intermediate metal is a plated palladium, so that the optical window is sealed with the cap body by means of the eutectic alloy between Bi contained in the low-melting point glass and Pd of the intermediate metal.

The intermediate metal is a Sn—Ni alloy plated layer, so that the optical window is sealed with the cap body by means of the eutectic alloy between Bi contained in the low-melting point glass and Sn—Ni alloy of the intermediate metal.

The intermediate metal is a Zn—Ni alloy plated layer, so that the optical window is sealed with the cap body by means of the eutectic alloy between Bi contained in the low-melting point glass and Zn—Ni alloy of the intermediate metal.

The intermediate metal is a Sn—Zn alloy plated layer, so that the optical window is sealed with the cap body by means of the eutectic alloy between Bi contained in the low-melting point glass and Sn—Zn alloy of the intermediate metal.

The low-melting point glass contains not less than 30 weight % of Bi. A first surface of the intermediate metal opposite to a second surface attached to the metal cap body is a rough surface, a crystal particle size of the first surface being 0.5 $\mu$m to 1.0 $\mu$m.

The intermediate metal attached to the metal cap body comprises multiple plated metal layers, at least one of the metal layers having a rough surface, a crystal particle size of which being 0.5 $\mu$m to 1.0 $\mu$m.

According to another aspect of the present invention, there is provided an optical device comprising: a stem; an optical element mounted on the stem; a cap body secured on the stem to accommodate therein the optical element, the cap body having an opening; an optical window made of glass plate sealed with the cap body to cover the opening so that an optical beam transmits through the optical window; and a sealing member for sealing the optical window with the metal cap, the sealing member including a bismuth low-melting point glass containing no lead, an intermediate metal layer attached on the metal cap body, the intermediate metal layer being a metal capable of eutectic reaction with respect to Bi contained in the low-melting point glass, and an eutectic alloy layer thus formed between the low-melting point glass and the intermediate metal layer.

According to sill another aspect of the present invention, there is provided a method of sealing an optical window, made of a glass plate, with a metal cap body, having an opening, for making an optical cap structure for semiconductor device, the method comprising the following steps of: attaching an intermediate metal layer to the metal cap body, the intermediate metal layer being a metal capable of causing an eutectic reaction with respect to Bi contained in a bismuth low-melting point glass containing no lead; setting the optical window and the cap body on a jig in such a manner that a sealing member including the low-melting point glass is placed between the intermediate metal layer and the optical window; and inserting the jig in a furnace to heat the same up to a temperature at which an eutectic reaction is caused between Bi contained in the low-melting point glass and a metal of the intermediate metal layer to seal the window with the cap body.

DETAILED DESCRIPTION OF THE PREFERRED EMBODIMENTS

Figure 1:
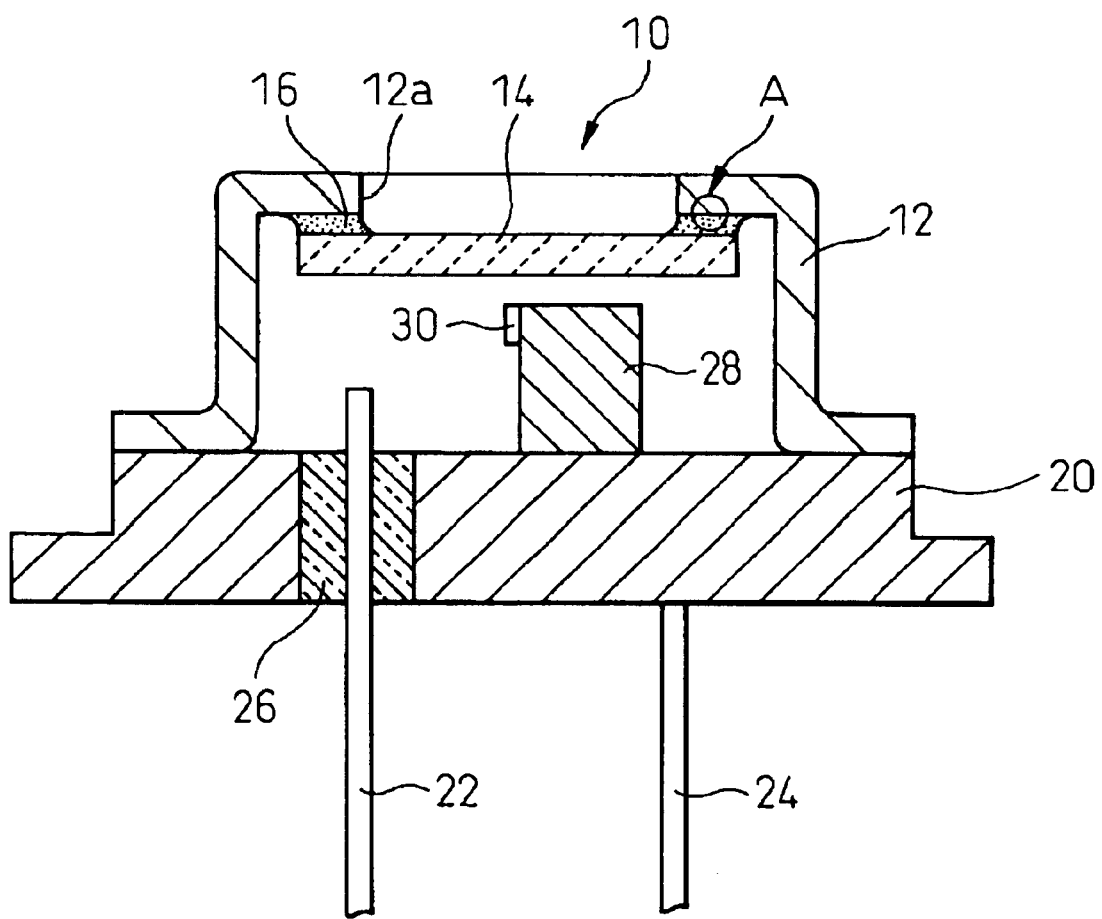
FIG. 1 is a cross-sectional view of a semiconductor optical device using a cap according to the present invention.

Referring to the drawings, some preferred embodiments of this invention will now be described in detail.

A cap for a semiconductor optical device according to the first embodiment of this invention comprises, as shown in FIGS. 1(a) and 1(b), a cap body 12, a optical transmission window 14 made of a glass plate sealed with the cap body 12 using a low-melting point glass as a sealing material. The cap body 12 is cap-like configuration formed by a press-forming process of a metal plate and has an upper portion provided with an optical transmission opening 12a. The optical transmission window 14 is sealed with a peripheral region of the optical transmission opening 12a by a low-melting point glass 16. The material of the cap body 12 is not limited, but may advantageously be iron, iron-nickel alloy, or iron-cobalt-nickel alloy.

The important features of the cap for semiconductor optical device according to this invention are that; the sealing material for sealing the optical transmission window 14 with the cap body 12 is a bismuth low-melting point glass containing no lead, in place of a low-melting point glass containing lead which has been conventionally used in the prior art; and that an intermediate metal layer, which is capable of effecting an eutectic reaction with Bi contained in the bismuth low-melting point glass, is attached to the surface of the cap body so that, when the optical transmission window 14 is sealed with the cap body 12, at the sealing temperature, an eutectic alloy layer is formed at a boundary between the cap body 12 and the low-melting point glass 16 by an eutectic reaction between a metal of the intermediate metal layer and Bi contained in the low-melting point glass. Thus, the optical transmission window 14 is sealed with the metal cap 12 by the bismuth low-melting point glass 16 and the eutectic alloy layer 24.

The metal capable of effecting an eutectic reaction with Bi contained in the bismuth low-melting point glass when the optical transmission window 14 is sealed with the cap body 12 may be Au, Ag, Sn, Zn, Pd or any other metal. Therefore, a metal, such as Au, Ag, Sn, Zn, Pd or another, is beforehand attached, such as by plating, to the surface of the metal cap 12. Thus, when the optical transmission window 14 is sealed with the cap body 12, the eutectic alloy is formed between Bi and a metal, such as listed above, to air-tightly seal the optical transmission window 14 with the cap body 12.

The thickness of the intermediate metal layer capable of effecting an eutectic reaction with Bi may be a thickness sufficient to form an eutectic alloy layer on the surface of the cap body 12. When the intermediate metal layer capable of effecting an eutectic reaction with Bi is plated onto the cap body, if it is necessary or appropriate to form beforehand a protective underlayer on the cap body, nickel, for example, is first plated on the metal cap and, then, the metal capable of effecting an eutectic reaction is plated thereon.

Some embodiments of producing an optical cap for semiconductor device using bismuth low-melting point glass according to the present invention will be described.

Although the component of bismuth low-melting point glass which can be used in this invention may not be limited, those containing at least $SiO_2$, $Al_2O_3$, MgO, ZnO, or $Bi_2O_3$ can advantageously be used in the embodiment. Here, $Bi_2O_3$ is a main component of bismuth low-melting point glass and, in the embodiment, bismuth low-melting point glass contains 50 weight percent of $Bi_2O_3$. As far as $Bi_2O_3$ is a material which effects an eutectic reaction with a metal attached to the cap body 12 to air-tightly seal the optical transmission window 14 with the cap body 12, a substantial amount (at least 30 weight %) of $Bi_2O_3$ must be contained in the low-melting point glass. The bismuth low-melting point glass may be a ring-shaped powder tablet corresponding to a dimension of the optical transmission opening 12a of the cap body 12 and may be set on a jig with the cap body 12 and the optical transmission window 14, or may be a paste which is beforehand coated on the optical transmission window 14.

In this embodiment, the cap body 12 is first plated with nickel as an underlayer and then plated with gold. Both nickel-plating and gold-plating are conducted as an electroplating in a barrel on the entire surface of the cap body 12. The thickness of the plated nickel is approximately 2 $\mu$m and the thickness of the plated gold is approximately 0.1 $\mu$m. The thickness of 0.1 $\mu$m of the gold-plated layer is sufficient to form an eutectic alloy layer with Bi contained in the low-melting point glass.

Then, the cap body 12, a tablet of low-melting point glass and the optical transmission window 14 are set onto a jig which is used for heat-sealing the optical transmission window 14 with the cap body 12.

Then, the cap body 12, a tablet of low-melting point glass and the optical transmission window 14, while being set on the jig, are inserted into a furnace, where they are heated up to a temperature of approximately 500° C. in nitrogen gas environment to melt the low-melting point glass so that the optical transmission window 14 is sealed with the cap body 12. When the low-melting point glass is melted in the furnace, a eutectic reaction is caused between the plated Au attached to the cap body 12 and Bi contained in the low-melting point glass to form an eutectic alloy layer of Au—Bi and thus the optical transmission window 14 is firmly sealed with the cap body 12. A eutectic reaction between Au and Bi can be effected at a temperature of approximately 240° C. and thus such an eutectic alloy layer of Au—Bi is simultaneously formed when the low-melting point glass is heated and melted.

Figure 2A:
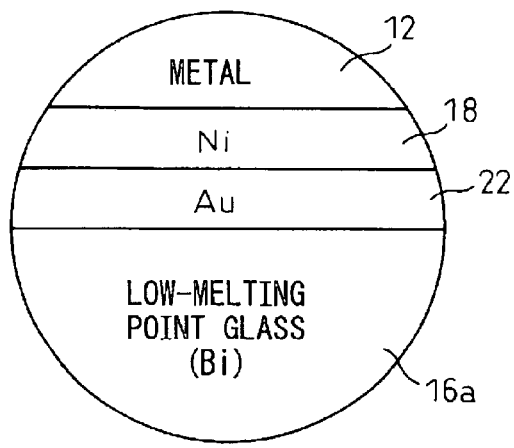
FIGS. 2(a) and 2(b) are cross-sectional views of an embodiment of sealing portion of an optical transmitting window.
Figure 2B:
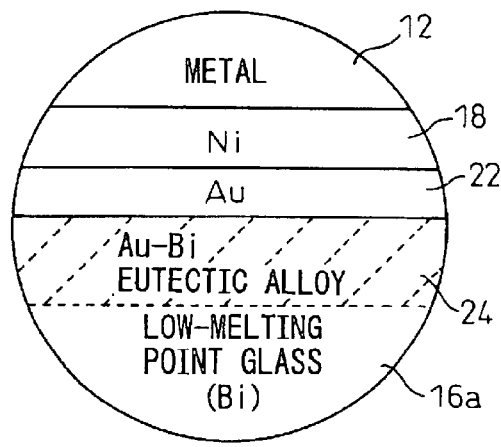

FIGS. 2(*a*) and 2(*b*) are enlarged views of the sealing portion between the optical transmission window 14 and the cap body 12 indicated by A in FIG. 1, illustrating before and after, respectively, in which the optical transmission window 14 is sealed with the cap body 12 by means of a bismuth low-melting point glass 16*a*.

As shown in FIG. 2(*a*), the cap body 12 is first plated with nickel as an underlayer 18 and then plated with gold 22 on the plated nickel layer 18. At the sealed state, both Au of the plated gold layer 22 and Bi contained in the low-melting point glass 16*a* are diffused to cause an eutectic reaction and, therefore, an eutectic alloy layer 24 of Au—Bi is formed at the boundary between the cap body 12 and the optical transmission window 14 and thus the optical transmission window 14 is air-tightly sealed with the cap body 12 by the thus formed eutectic alloy layer 24 of Au—Bi.

Figure 3A:
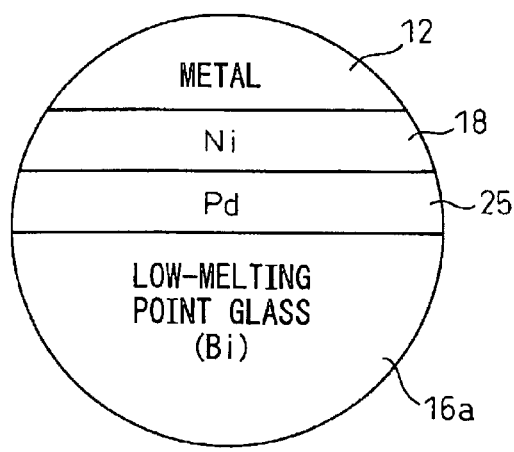
FIGS. 3(a) and 3(b) are cross-sectional views of another embodiment of sealing portion of an optical transmitting window.
Figure 3B:
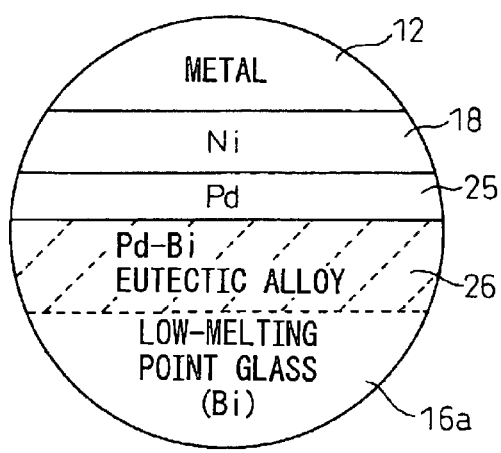

FIGS. 3(*a*) and 3(*b*) show another embodiment of the sealing portion, illustrating before and after, respectively, the optical transmission window 14 is sealed with the cap body 12 by means of a bismuth low-melting point glass 16*a* in the same manner as the previous embodiment. As shown in FIG. 3(*a*), the cap body 12 is first plated with nickel as an underlayer in the same manner as the previous embodiment, but then plated with palladium 25 on the plated nickel layer 18.

The thickness of the palladium plated layer 25 is 0.1 $\mu$m. An eutectic reaction between Pd and Bi can be effected at a temperature of approximately 256° C. Therefore, at a temperature of approximately 500° C. in the furnace, an eutectic reaction is caused and, therefore, a eutectic alloy layer 24 of Pd—Bi is formed at the boundary between the cap body 12 and the optical transmission window 14 and thus the optical transmission window 14 is air-tightly sealed with the cap body 12 by the thus formed eutectic alloy layer 24 of Pd—Bi.

In the previous embodiment, in which the gold plated layer 22 is formed on the cap body 12, the surface of the metal cap 12 is lustrous, but in this embodiment, in which the palladium plated layer is formed on the cap body 12, the surface of the metal cap 12 is lusterless and rough as compared with the gold plated layer. Therefore, light reflection at the inside surface of the cap can more effectively be prevented.

In this embodiment, if the nickel plated layer 18, as an underlayer of the palladium plated layer, is formed so as to have a rough surface, it seems that the optical transmission window 14 can more tightly be sealed with the cap body 12 due to a so-called an "anchor effect" between the nickel plated layer 18 and the palladium plated layer 25.

The following Table 1 shows experimental results of the adhering strength of the optical transmission window 14 with respect to the cap body 12 in this embodiment, comparing the case in which the nickel plated layer 18 is formed in a usual manner, with the case in which the nickel plated layer 18 is formed to have a rough surface.

TABLE 1

| Pd/Ni | Ni Plated Underlayer | Adhering Strength |
|---|---|---|
| ① | Usual Surface Plating | 3.8 kgf |
| ② | Rough Surface Plating | 4.9 kgf |

These results apparently show that, if the nickel plated underlayer 18 was formed so as to have a rough surface, the adhering strength of the optical transmission window 14 would be increased. Therefore, if such an underlayer is formed, it would be advisable to form the underlayer to have a rough surface on which a metal layer which is capable of an eutectic reaction with Bi is formed, so that the optical transmission window 14 can more tightly be sealed with the cap body 12.

The thickness of the nickel plated underlayer 18 is 2 $\mu$m to 9 $\mu$m, and the crystal particle size is 0.5 $\mu$m to 1.0 $\mu$m.

Although, in the above embodiment, the nickel plated underlayer 18 is formed so as to have a rough surface, it is also possible to form the palladium plated layer to have a rough surface to increase the adhering strength between the optical transmission window 14 and the cap body 12 as compared with the palladium plated layer formed by a usual manner.

A rough surface of the nickel plated underlayer 18 or the intermediate metal layer capable of effecting an eutectic reaction with Bi may be formed by any appropriate process, such as a plating process for forming such a rough surface, a chemical process, such as etching, or physical process, such as sand-blasting.

Figure 4A:
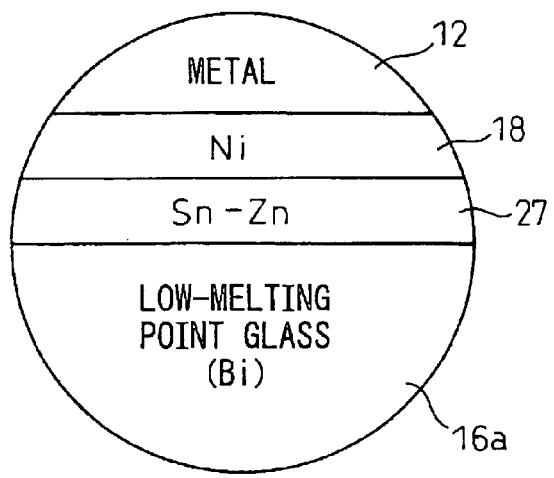
FIGS. 4(a) and 4(b) are cross-sectional views of still another embodiment of sealing portion of an optical transmitting window.
Figure 4B:
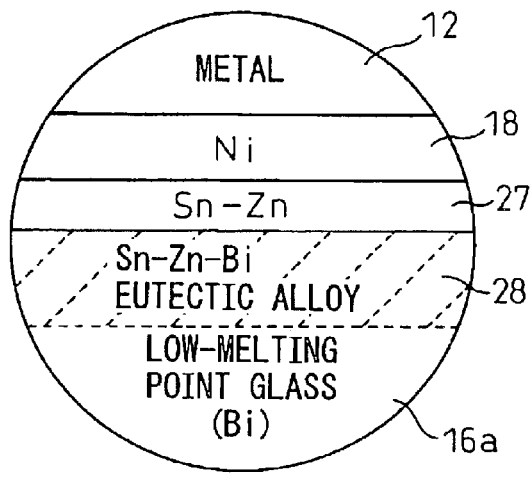
Figure 5:
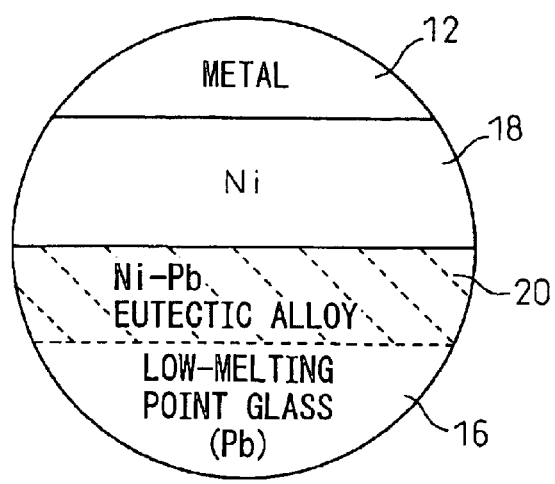
FIG. 5 is a cross-sectional view of sealing portion of an optical transmitting window known in the prior art.

FIGS. 4(*a*) and 4(*b*) show a third embodiment of the sealing portion, illustrating before and after, respectively, the optical transmission window 14 is sealed with the cap body 12 by means of a bismuth low-melting point glass 16*a* in the same manner as the previous embodiments. As shown in FIG. 3(*a*), the cap body 12 is first plated with nickel as an underlayer, in the same manner as the previous embodiments, and is then plated with Sn—Zn alloy layer 27 on the plated nickel layer 18.

The temperature at which an eutectic reaction is developed between Bi and Sn—Zn alloy is approximately 200° C. Therefore, during the operation of sealing the optical transmission window 14 with the cap body 12, an eutectic alloy layer 28 of Sn—Zn—Bi is formed at the boundary between the cap body 12 and the bismuth low-melting point glass 16*a*, so that the optical transmission window 14 is air-tightly sealed with the cap body 12 by thus formed eutectic alloy layer 28 of Sn—Zn—Bi.

In addition, the temperature at which an eutectic reaction is caused between Bi and Sn is approximately 140° C., between Bi and Sn is approximately 254° C., and between Bi and Ag is approximately 260° C. Therefore, in the same manner as the previous embodiments, an Sn—Ni alloy, or Zn—Ni alloy, or silver can be plated on the surface of the cap body 12. During the operation of sealing the optical transmission window 14 with the cap body 12 using a bismuth low-melting point glass 16*a*, an eutectic alloy layer of Sn—Bi, an eutectic alloy layer of Zn—Bi, and an eutectic alloy layer of Ag—Bi can be formed at the boundary between the cap body 12 and the bismuth low-melting point glass 16*a*, so that the optical transmission window 14 is air-tightly sealed with the cap body 12 by thus formed eutectic alloy layer, in the same manner as the previous embodiments.

If an Sn—Ni alloy, or Zn—Ni alloy, or Sn—Zn alloy is plated on the surface of the cap body 12, the surface of the cap body 12 becomes rough, so that, in the same manner as the case in which palladium is plated on the surface of the cap body 12, light reflection at the inside surface of the cap can more effectively be prevented and a generation of noise in the semiconductor device is also more effectively restricted as compared with the case in which a gold is plated.

As described above, a cap for semiconductor device according to the present invention is constructed by means of a bismuth low-melting point glass 16*a*, containing no lead, as a sealing material for sealing the optical transmitting window 14 to the cap body 12. Therefore, a "no-lead" process for manufacturing the cap of semiconductor device can be attained. In addition, according to the present invention, a eutectic alloy layer is formed between Bi contained in the bismuth low-melting point glass 16*a* and an intermediate metal attached to the surface of the cap body, such as plating, so that the optical transmitting window is sealed with the cap body 12 by means of thus formed eutectic alloy layer. Therefore, the optical transmitting window can be more reliably sealed with the cap body 12 with high air-tight and moisture endurable performance and thus the cap can be advantageously used for a semiconductor device accommodating therein an optical element, such as a laser diode.

It should be understood, by those skilled in the art, that the foregoing description relates to only a preferred embodiment of the disclosed invention, and that various changes and modifications may be made to the invention without departing the sprit and scope thereof. In this connection, this invention can be applied not only to a semiconductor device accommodating therein a laser diode, but also to various caps for semiconductor devices including general optical transmitting windows.

What is claimed is:

1. An optical cap structure for semiconductor device, said structure comprising:

a cap body having an opening;

an optical window made of glass plate sealed with said cap body to cover said opening so that an optical beam transmits through said optical window; and a sealing member for sealing said optical window with said metal cap, said sealing member including a bismuth low-melting point glass containing no lead, an intermediate metal layer attached to said metal cap body, said intermediate metal layer being a metal capable of causing a eutectic reaction with respect to Bi contained in said low-melting point glass, and an eutectic alloy layer thus formed between said low-melting point glass and said intermediate metal layer.

2. An optical cap structure as set forth in claim 1, wherein said intermediate metal is a plated gold, so that said optical window is sealed with the cap body by means of the eutectic alloy of Bi contained in said low-melting point glass and Au of the intermediate metal.

3. An optical cap structure as set forth in claim 1, wherein said intermediate metal is a plated palladium, so that said optical window is sealed with the cap body by means of the eutectic alloy of Bi contained in said low-melting point glass and Pd of the intermediate metal.

4. An optical cap structure as set forth in claim 1, wherein said intermediate metal is a Sn—Ni alloy plated layer, so that said optical window is sealed with the cap body by means of the eutectic alloy of Bi contained in said low-melting point glass and Sn—Ni alloy of the intermediate metal.

5. An optical cap structure as set forth in claim 1, wherein said intermediate metal is a Zn—Ni alloy plated layer, so that said optical window is sealed with the cap body by means of the eutectic alloy of Bi contained in said low-melting point glass and Zn—Ni alloy of the intermediate metal.

6. An optical cap structure as set forth in claim 1, wherein said intermediate metal is a Sn—Zn alloy plated layer, so that said optical window is sealed with the cap body by means of the eutectic alloy of Bi contained in said low-melting point glass and Sn—Zn alloy of the intermediate metal.

7. An optical cap structure as set forth in claim 1, wherein said low-melting point glass contains not less than 30 weight % of Bi.

8. An optical cap structure as set forth in claim 1, wherein a first surface of the intermediate metal opposite to a second surface attached to the metal cap body is a rough surface, a crystal particle size of said first surface being 0.5 $\mu$m to 1.0 $\mu$m.

9. An optical cap structure as set forth in claim 8, wherein the intermediate metal attached to the metal cap body comprises multiple plated metal layers, at least one of the metal layers having a rough surface, a crystal particle size of which being 0.5 $\mu$m to 1.0 $\mu$m.

10. An optical device comprising:

a stem;

an optical element mounted on said stem;

a cap body secured on said stem to accommodate therein said optical element, said cap body having an opening;

an optical window made of glass plate sealed with said cap body to cover said opening so that an optical beam transmits through said optical window; and a sealing member for sealing said optical window with said metal cap, said sealing member including a bismuth low-melting point glass containing no lead, an intermediate metal layer attached to said metal cap body, said intermediate metal layer being a metal capable of eutectic reaction with respect to Bi contained in said low-melting point glass, and a eutectic alloy layer thus formed of said low-melting point glass and said intermediate metal layer.

* * * * *